United States Patent
Schneider et al.

(10) Patent No.: US 10,371,745 B2
(45) Date of Patent: Aug. 6, 2019

(54) OVERHEAT PROTECTION CIRCUIT AND METHOD IN AN ACCELERATED AGING TEST OF AN INTEGRATED CIRCUIT

(71) Applicant: Micron Technology, Inc., Boise, ID (US)

(72) Inventors: Ronny Schneider, Munich (DE); Martin Brox, Munich (DE); Juan-Antonio Ocon-Garrido, Munich (DE)

(73) Assignee: Micron Technology, Inc., Boise, ID (US)

( * ) Notice: Subject to any disclaimer, the term of this patent is extended or adjusted under 35 U.S.C. 154(b) by 543 days.

(21) Appl. No.: 14/162,282

(22) Filed: Jan. 23, 2014

(65) Prior Publication Data
US 2015/0204941 A1 Jul. 23, 2015

(51) Int. Cl.
| | |
|---|---|
| G11C 7/04 | (2006.01) |
| G01R 31/28 | (2006.01) |
| G11C 29/06 | (2006.01) |
| G11C 29/56 | (2006.01) |

(52) U.S. Cl.
CPC ............ G01R 31/2855 (2013.01); G11C 7/04 (2013.01); G11C 29/06 (2013.01); G11C 29/56 (2013.01)

(58) Field of Classification Search
None
See application file for complete search history.

(56) References Cited

U.S. PATENT DOCUMENTS

| | | | | |
|---|---|---|---|---|
| 5,451,896 A | * | 9/1995 | Mori | H01L 27/0214 327/306 |
| 2002/0121913 A1 | * | 9/2002 | Miller | G01R 31/2874 324/750.05 |
| 2003/0210505 A1 | * | 11/2003 | Partsch | G11C 7/04 361/103 |
| 2005/0040810 A1 | * | 2/2005 | Poirier | G01R 31/2884 716/106 |
| 2005/0105367 A1 | * | 5/2005 | Kim | G11C 5/14 365/226 |
| 2008/0309361 A1 | * | 12/2008 | Kita | G01R 31/2855 324/750.05 |
| 2009/0161722 A1 | * | 6/2009 | Gorman | G01K 3/005 374/142 |
| 2011/0194223 A1 | * | 8/2011 | Kang | H02H 5/042 361/106 |
| 2013/0326459 A1 | * | 12/2013 | Bickford | G06F 17/5045 716/133 |

\* cited by examiner

Primary Examiner — Sujoy K Kundu
Assistant Examiner — Brent A. Fairbanks
(74) Attorney, Agent, or Firm — Dorsey and Whitney LLP

(57) ABSTRACT

To include in a device a controller to control operation of the device in a normal-operation mode and in a test mode for performing one or more tests including an accelerated aging test, a temperature sensor to measure operating temperature of the device, and an overheat protection circuit to prevent overheating of the memory device during the test mode. With this overheat protection circuit, a device may undergo an efficient and reliable accelerated aging test with reduced or non-existent, possibility of suffering an overheat damage.

16 Claims, 8 Drawing Sheets

OVERHEAT PROTECTION CIRCUIT AND METHOD IN AN ACCELERATED AGING TEST OF AN INTEGRATED CIRCUIT

BACKGROUND

Field

The present disclosure relates to an integrated circuit (IC) and an information processing device including the same, and more particularly relates to an accelerated aging test of an integrated circuit device and an information processing device including the same.

Description of the Related Art

Many integrated circuits, or ICs, experience degradation over time due to aging of the underlying transistors. Causes of this aging may include a repeated current consumption, leakage current production, heating of the device (due to high temperature), and/or physical degradation of parts due to passage of time.

Various aging effects cause continuous performance and reliability degradation during circuit run-time usage. Thus, in order to ensure the lifetime circuit reliability, an IC chip usually goes through what is called an accelerated aging test after fabrication and before commercial usage.

An accelerated aging test is a test that applies various aging conditions to an IC chip to observe the expected overall lifetime circuit performance and reliability, as well as vulnerability to the aging conditions. The aging conditions usually include a higher than normal operating voltage, a higher than normal loads, and/or a higher than normal operating temperature, etc.

It is also called an accelerated aging test which is run with more aggravated conditions to speed up the normal aging process of the IC chips and devices including the same. This accelerated aging test is beneficial because it helps determine the long term degradation effects of such aging conditions on IC chips and devices within relative a short time.

By performing such an accelerated aging test on an IC chip, it can be known whether any part of the chip produces too much leakage current, is incapable of dissipating power or current, or is heated up too much to cause overheat damages to adjacent parts, and/or is vulnerable to any of the aging conditions. Subsequently, only those IC chips that pass the test, which have shown certain level of performance under the tested aging conditions, can be marked ready for usage.

The aggravated conditions used in the accelerated aging test, such as a higher than normal operating voltage, however, often lead to an increased amount of leakage current on the tested IC chip, which can overheat the chip. Such an overheating of the chip may cause various malfunctioning damages to the chip and the tester device as well. Although the chip may recover from the overheat damages when it is allowed to cool, it is not always the case. Sometimes, the overheat damages may be permanent and not reversible. Furthermore, such overheat damages can be done not only to the overheated chip but also to the tester device as well.

Due to these overheat problems, an accelerated aging test has been limited to such an extent that the testing aging conditions are controlled so as not to cause the overheat problems in the tested chip and the tester device. Specifically, more alleviated aging conditions are chosen to prevent the overheat damages, and these conditions are often insufficient to simulate a proper aging of the tested IC chip to appropriately judge the chip's overall reliability and performance, including the vulnerability/resistibility to the long-term effects of the aging conditions. This often reduces the efficiency of the accelerated aging test.

SUMMARY

In accordance with at least one aspect of the claimed subject matter, an IC chip and any device including the same may undergo an efficient and reliable accelerated aging test with reduced, or non-existent, possibility of suffering the overheat-damages.

In accordance with at least one aspect of the claimed subject matter, an IC chip and any device including the same that undergo an accelerated aging test can automatically suppress overheating of the IC chip, if the operating temperature reaches a certain predetermined level.

In accordance with at least one aspect of the claimed subject matter, an IC chip and any device including the same may undergo an accelerated aging test, where the aging conditions are automatically adjusted so as to prevent the overheating of the chip.

In accordance with at least one aspect of the claimed subject matter, an IC chip and any device including the same may undergo an accelerated aging test, where weak areas/parts that are more vulnerable to the aging conditions by, for example, producing too much leakage current and/or heat, are marked as requiring a fix or improvement after the test.

In accordance with at least one aspect of the claimed subject matter, an IC chip and any device including the same may undergo an accelerated aging test, where the information relating to the weak parts/areas is stored in a memory area of the chip for later reference by an external device.

In accordance with at least one aspect of the claimed subject matter, there is provided a memory device that includes: a controller configured to control an operation of the memory device in a normal mode or in a test mode; and an over-temperature monitor circuit configured to detect an over-temperature of the memory device and output a state indicating the over-temperature in the test mode.

In accordance with at least one aspect of the claimed subject matter, there is provided a memory device that includes: a controller configured to control an operation of the memory device in a normal mode or in a test mode; a temperature sensor configured to measure a temperature of the memory device; and a comparator configured to be activated in the test mode to compare the temperature of the memory device in the test mode with a predetermined value and output a compared result.

Aging means that certain properties such as resistive paths and driveability of devices change. Most aging phenomena follow an exponential law where the exponent is smaller than 1. Different aging or better degradation processes have different exponents in the $x^e$ law ($x$~time; $e<1$). The change rate of aging is high at the beginning and becomes less in time. As an example, a certain current driveability of a device might be reduced by 20% in the first year and in the following 5 years by another 10%. Semiconductor products are sold when the change rate (of the "properties" of the devices) is low/acceptable within the margins of tests. That means that the devices should be left for several years or they do aging. With accelerated aging such products can be substantially aged in much less time. For this the devices are put under "unnatural conditions" like unnatural high temperature and voltages. That is, such accelerated aging is performed with intent and the devices degrade is also intended. Customers are delivered the devices that behave as if they are several years old already. The aging should be performed in as short a time as possible. Therefore the acceleration conditions will be chosen to be as extreme as possible. On the contrary, side effects of the accelerated aging should be avoided. The ICs are smaller and smaller so the energy density becomes higher and higher. Depending in transistor characteristics, some devices will run into a vicious circle that leads to their destruction. High temperature causes to increase currents/current densities inside the device. Increased current consumption will heat up the device more than the elevated temperature in the "burn oven". If the local device heats up higher, its current consumption gets higher and so forth. Eventually the device melts and also might destroy the test equipment that it is tested with. This problem provides the damage to the test system.

BRIEF DESCRIPTION OF THE DRAWINGS

The above features and advantages of the claimed subject matter will be more apparent from the following description of the claimed subject matter when taken in conjunction with the accompanying drawings, in which:

DETAILED DESCRIPTION OF THE EMBODIMENTS

Figure 1:
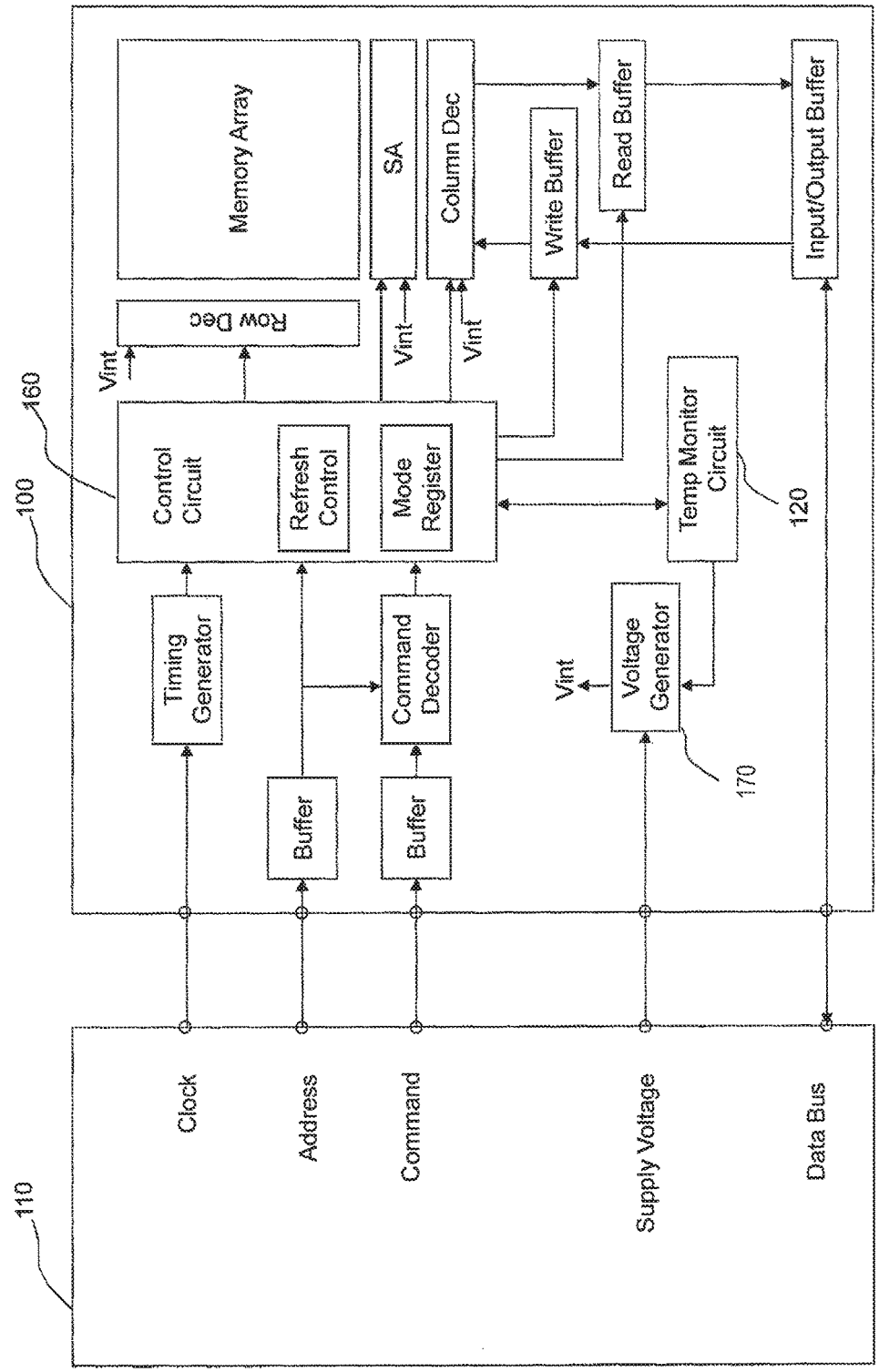
FIG. 1 is a schematic block diagram showing an example of a configuration of an IC device 100 connected to a tester device 110.

Various aspects of the claimed subject matter will be explained below in detail with reference to the accompanying drawings. In the following description, the same or corresponding parts are denoted by the same reference characters. Their names and functions are also the same. Thus, a detailed description thereof will not be repeated.

FIG. 1 is a schematic block diagram showing an example of a configuration of an IC device connected to a tester device. The IC device 100, in FIG. 1, is a Dynamic Random-Access Memory (DRAM) device. The terms "IC device 100," "DRAM 100," and "memory device 100" may be used interchangeably herein. The DRAM 100 includes a memory array, a row and column decoder, and a read and write buffer. The DRAM 100 may use one of the most advanced memory organization technology. For example, the DRAM 100 may use an 8$n$ prefetch architecture to achieve high-speed operation. 8$n$ prefetch architecture means that the internal data bus to/from the memory core/memory array is 8 times as wide as the I/O interface but operated at only ⅛ of the I/O data rate. Such memory organization architecture may offer the best compromise between the need for fine access granularity and fastest array speeds.

The DRAM 100 may run off two different clocks. For example, commands and addresses may be referenced to a differential clock (CK, /CK). Commands maybe registered at every rising edge of CK, whereas addresses may be registered at every rising edge of CK and every rising edge of /CK. On the other hand, read and write data may be referenced to another clock, such as, a free-running differential forwarded clock (WCK, /WCK).

The DRAM 100 further includes a temperature monitor circuit 120, a voltage generator 170, and a control circuit 160. The temperature monitor circuit 120 is configured to measure and/or monitor the operating temperature of the memory device 100. The temperature monitor circuit 120 may be configured to measure the operating temperature periodically (e.g., in every fixed time interval), in response to a measurement-trigger signal, or based on the rate of the memory's refresh operation. For example, the temperature sensor of the memory device 100 may be controlled or programmed so that the temperature measurement is made once at each of a plurality of different reference temperatures at an interval of a present number of times of refresh operations and a plurality of latch circuits holding the results of temperature measurement.

Still referring to FIG. 1, the temperature monitor circuit 120 is connected to the control circuit 160. The control circuit 160 is a controller for the memory device. The voltage generator 170 is connected to the temperature monitor circuit 120 so that the output of the temperature monitor circuit 120 can be fed into the voltage generator 170. Vint is the internal voltage generated by the voltage generator 170, and may be used as operating voltage of the memory device 100. For example, Vint, or any voltage derived from it, maybe fed into the row decoder, column decoder, and functional memory address (SA) unit. Vint may be a single voltage or multiple voltages that are derived from the output voltage generated by the voltage generator 170.

The voltage generator 170 is just an example of an internal voltage generator in a memory device such as DRAM 100. Various other forms of an internal voltage generator can be used with the claimed subject matter, which will be apparent to one of ordinary skill in the art reading the present disclosure.

The DRAM 100 includes buffers, decoders, controller, and other units not explained above, whose structural and functional configurations will be apparent to one of ordinary skill in the art, and thus, an unnecessary description will be omitted.

The DRAM 100 provides hardware support for various adaptive interface trainings and an accelerated aging test to ensure data integrity and reliability. For example, the adaptive interface trainings may include but not limited to a power-up training for detecting the device configuration and mirror function, an address training for observing and adjusting address input timing, a clock training for ensuring a certain required phase relationship between multiple clocks, a read-data training for aligning the data bus to the respective clock and detecting burst boundaries out of a continuous read data stream, a write-data training for aligning the data bus to the respective clock and detecting burst boundaries out of a continuous write data stream, and/or a continuous training for observing and compensating for data eye drift (at a high data rate, even small changes in supply voltage or temperature may shift the write and read data eye position). In sum, such trainings can compensate for all imbalances in the interface timing resulting from impedance mismatches, unmatched trace length in PCB routing and differences in path delays due to process, voltage and temperature.

Additionally and/or alternatively, accelerated aging tests may also be performed to ensure a long-term integrity and reliability of the memory device, the DRAM 100. The aging conditions include, for example, a higher than normal operating voltage, a higher than normal supply voltage, a higher than normal current consumption, and/or a higher than normal temperature, in order to simulate an accelerated aging of the device. All interface trainings and tests, including accelerated aging tests, may be orchestrated by the memory controller.

In particular, the test values may be selected to simulate an accelerated aging of the memory device 100 to see the long-term effects of the aging and to ensure the satisfactory performance and reliability of the memory device over its life time. As explained above, the conditions that are required to simulate an aging of the memory device are more severe than the conditions that the memory device would otherwise experience in the normal-operation mode. The memory device is subject to a higher than normal operating voltage or a higher than normal temperature during the accelerated aging test. Such severe conditions can result in overheating of the memory device (e.g., DRAM 100) and/or the test device (e.g., 110), and severe overheat damages to both.

However, the memory device in accordance with the claimed subject matter can prevent such overheating and thus can protect the memory device (e.g., DRAM 100) as well as the tester circuit (e.g., 110). For example, the temperature monitor circuit 120 monitors the temperature of the memory device 100, and if it reaches a predetermined temperature level, the memory device takes various actions to reduce the operating current consumption, thereby to lower the operating temperature of the memory device. More detailed descriptions are made below in conjunction with DRAM 100.

Referring to FIG. 1, inside DRAM 100, there is provided a control circuit 160. Inside the control circuit 160, there is, among other things, a refresh control unit and a mode register unit. The refresh control unit, for example, determines a refresh rate (e.g., refresh frequency) of the memory, and the mode register, for example, determines and stores a mode the memory is currently operating in—e.g., a test mode or a normal mode.

Still referring to FIG. 1, the DRAM 100 is connected to a tester device 110. The tester device 110 performs an accelerated aging test on the DRAM 100. The tester device 110 includes, for example, a unit supplying a tester clock signal, a unit supplying a tester address signal, a unit supplying a tester command signal, a unit supplying a tester voltage, and/or a data bus connected to the DRAM 100.

The tester device 110 in FIG. 1 is an example of a configuration of a testing circuit for performing an accelerated aging test, and any obvious variants are intended to be within the present disclosure.

During the test mode, the tester device 110 can supply to DRAM 100 a clock signal, address, command signal, supply voltage, and/or data. By varying the above input signals, the tester device 110 may simulate different conditions for the DRAM 100. However, when the conditions include a higher than normal operating/supplying voltage, as is the case for an accelerated aging test, the DRAM 100 produces greater than normal amount of heat, and is likely to be overheated. If the DRAM 100 is overheated, it may damage not only the DRAM 100 but also the tester device 110.

In order to prevent such overheating, the DRAM 100 has a temperature monitor circuit 120 monitoring the temperature of the device 100, which causes the DRAM 100 to have reduced operating current consumption (e.g., through the control circuit 160), if the measured temperature reaches a predetermined level (e.g., overheat trigger point). Accordingly, the DRAM 100 can lower the risk of being overheated and thus can prevent itself from the overheat-damages.

Although the tested IC circuit shown in FIG. 1 is a DRAM, it can be any IC device, including but not limited to the following: a data processing unit (e.g., CPU), input-output unit (I/O), Read-only memory (ROM), and other IC chip-based devices.

Figure 2A:
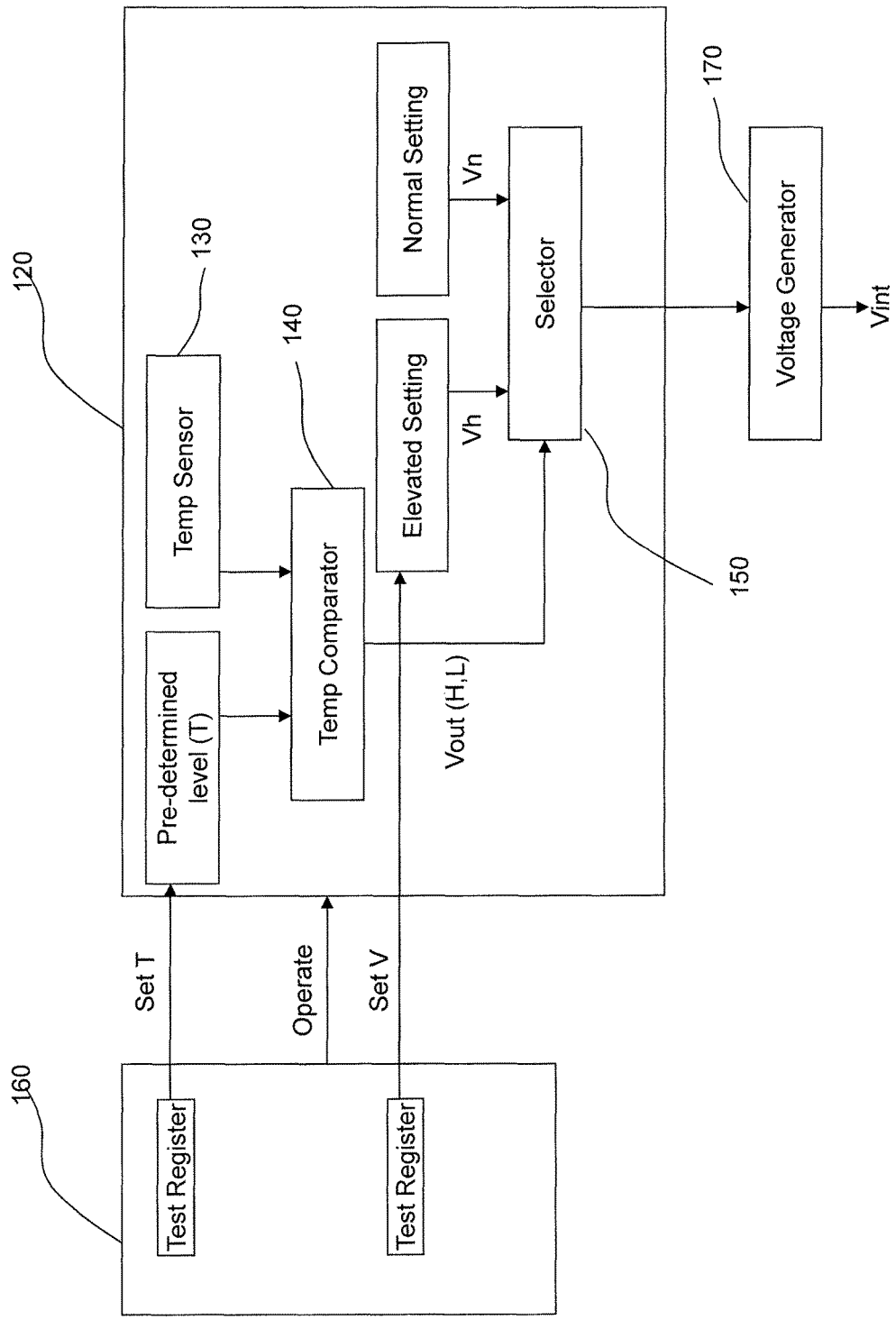
FIG. 2A is a block diagram showing an example of a configuration of a temperature monitor circuit 120 and a control circuit 160 according to a first embodiment.

FIG. 2A is a block diagram showing an example of a configuration of a temperature monitor circuit 120 and a control circuit 160 according to a first embodiment. In FIG. 2, the control circuit 160 sets a predetermined temperature level T (e.g., overheat trigger point) as well as a testing voltage level V. This testing voltage level may include either or both the elevated voltage level, Vh, and the normal voltage level, Vn. Further, either or both these values may be input from the tester device 110 and fed into the control circuit of the memory device, or may be pre-set in the memory device 100. The elevated voltage level, Vh, is higher than the normal voltage level, Vn.

The predetermined temperature T is the temperature trigger point such that if the operating temperature of the memory device 100 reaches this predetermined temperature level T, the memory device changes its operating conditions to be in a reduced-current-consumption state to ultimately lower the operating temperature.

There may be provided inside the temperature monitor circuit 120 one or more memory areas to store the predetermined temperature level T, the elevated voltage level Vh, and/or the normal voltage level Vn.

The temperature sensor 130 monitors the operating temperature of the memory device 100. The temperature comparator, Temp Comparator 140, compares the temperature measured by the temperature sensor 130 and the predetermined temperature level T. The temp comparator 140 then sends a result of the comparison to selector 150.

The result of this comparison can be used to trigger the overheat protection mechanism in DRAM 100. For example, the temp comparator 140 may output a high voltage level, (Vout=H), if the predetermined temperature level T is equal to or greater than the temperature of the memory device 100 determined by the Temp Sensor 130. In such a case, the temperature level of the memory device 100 is considered to be at a high-risk level, and the overheat protection mechanism maybe triggered. On the other hand, the temp comparator 140 may output a low voltage level, (Vout=L), if the predetermined temperature level T is less than the temperature of the memory device 100 determined by the Temp Sensor 130. In such a case, the temperature level of the memory device 100 is not at a high-risk level, and the testing operation may continue.

Such a temp comparator may be activated to compare the temperatures and to subsequently output a comparison result only during the test mode of the memory device, and be deactivated during the normal mode of the memory device. Alternatively, the temp comparator may be left activated regardless the mode of the memory device. The activation/ deactivation of the comparator based on the modes of the memory device may be implemented through the mode-register of the controller.

Referring to FIG. 2A, if the temperature of the memory device 100 measured by the temperature sensor 130 is less than the predetermined temperature level T, (Vout=L), the selector 150 may select the elevated voltage level, Vh, instead of the normal voltage level, Vn. The voltage generated by the voltage generator 170 is Vint, and thus when Vh is selected by the Selector 150, Vint will be at Vh. This voltage, Vh, could then be fed into various components of the memory device 100 and/or used as the internal operating voltage of the memory device 100.

On the other hand, if the temperature of the memory device 100 measured by the temperature sensor 130 is equal to or greater than the predetermined temperature level T, (Vout=H), the testing condition is changed to reduce the current consumption and to lower the temperature of the memory device 100. For example, the selector 150 may select the normal voltage level, Vn, which is lower than the elevated voltage level, Vh, when Vout is high. Vint generated by the voltage generator 170 will be then Vn, which means that the internal operating voltage of the memory 100 will reduce to Vn from Vh. This lower operating voltage will reduce the current consumption and ultimately lower the temperature of the memory device 100. Consequently, the overheating of the memory device 100 is prevented.

Vint maybe a single voltage or multiple voltages derived from the output of the voltage generator.

Figure 2B:
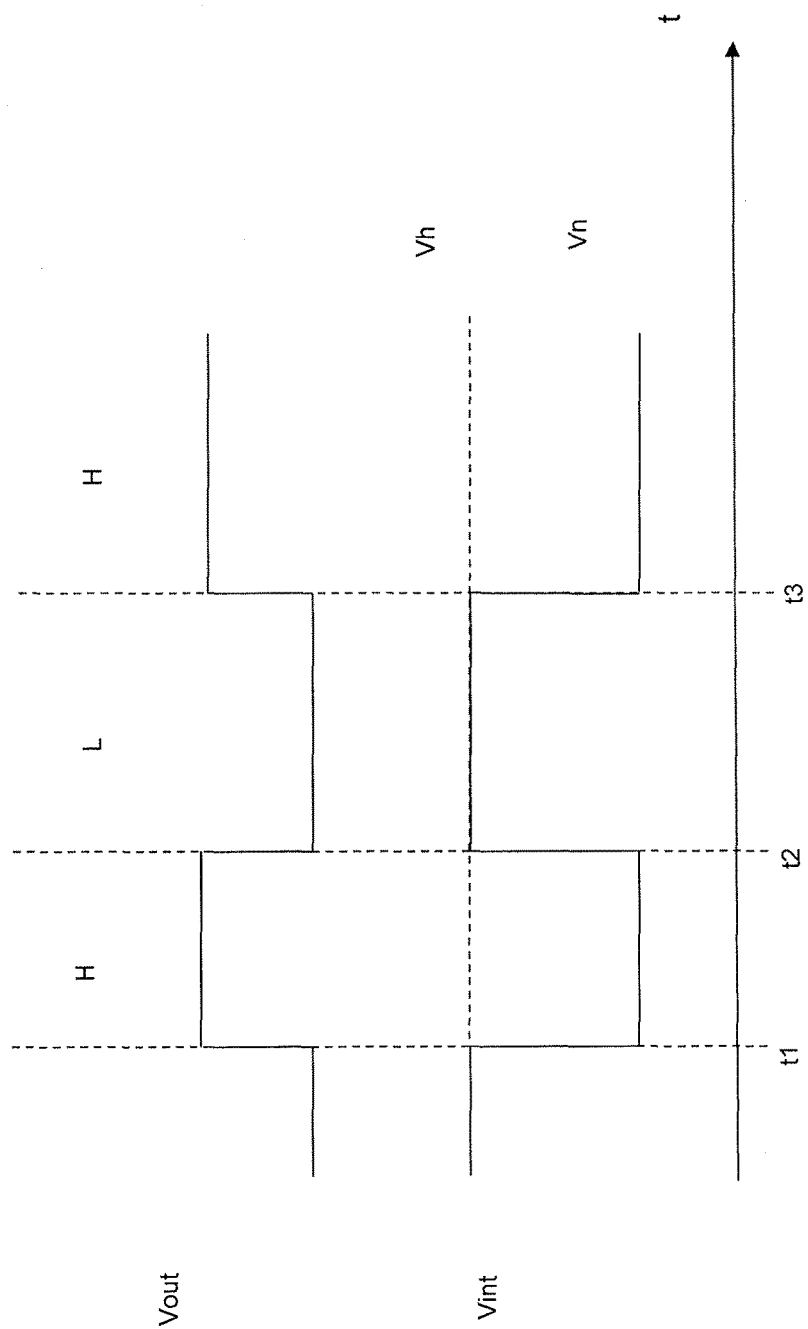
FIG. 2B is a timing diagram showing an example of an output voltage of the temperature comparator 140 and a voltage generated by the voltage generator 170 over a span of time according to the embodiment shown in FIG. 2A.

FIG. 2B is a timing diagram showing an example of an output voltage of the temp comparator 140 and a voltage generated by the voltage generator 170 in the embodiment shown in FIG. 2A. From the initial time until t1, the memory device 100 is in a test mode since the output voltage of the voltage generator, Vint, is at the elevated voltage level, Vh. Before t1, the output of the temperature comparator, Vout, is low, which means that the temperature of the memory device 100 has not reached the overheat protection trigger point, T. Thus, until t1, the memory device 100 continues to be operated under the testing conditions with the elevated voltage level, Vh.

In FIG. 2B, the y-axis is not shown on purposes, because the Vout timing diagram is intended to be read separate from the Vint diagram. For example, the values for Vout should not be interpreted as higher than the values for Vint, just because the Vout diagram is placed above the Vint diagram. Further, the x-axis (the time-axis) is not on scale.

At t1, the output of the temperature comparator, Vout, becomes high, indicating that the temperature of the memory device 100 has reached the trigger point, T. Then, the selector 150 selects the normal voltage, Vn, instead of the elevated voltage, Vh, and consequently, the Vint generated by the voltage generator will be reduced to Vn from Vh. As the temperature of the memory device 100 will not likely go down immediately after the operating voltage is lowered, the Vout continues to be high for a period of time even after the Vint has gone down to Vn from Vh, as shown in FIG. 2B.

At t2, the output of the temperature comparator, Vout, has finally gone down to the low level, indicating that the temperature of the memory device 100 has become lower than the predetermined temperature level, T (the overheat protection trigger point). Then, the selector 150 may select the elevated voltage, Vh, again, and thus, the Vint may be elevated back to Vh from Vn. The memory device 100 will be operated with this elevated voltage, Vh, until its temperature reaches again the predetermined temperature level T, at which point the overheat protection mechanism is triggered again by selecting a lower voltage as explained above. In FIG. 2B, this occurs at t3, and the overheat protection mechanism that occurred at time t1 repeats at time t3.

Again, the timing diagram in FIG. 2B is not on scale, and the relative timings/intervals between t1, t2, t3, etc, should not limit the claimed subject matter in any way.

Further, there may be a single elevated voltage level, Vh, as shown in FIGS. 2A and 2B, or multiple elevated voltage levels. An example of the latter case is illustrated in FIGS. 3A and 3B and is described in further detail below.

Figure 3A:
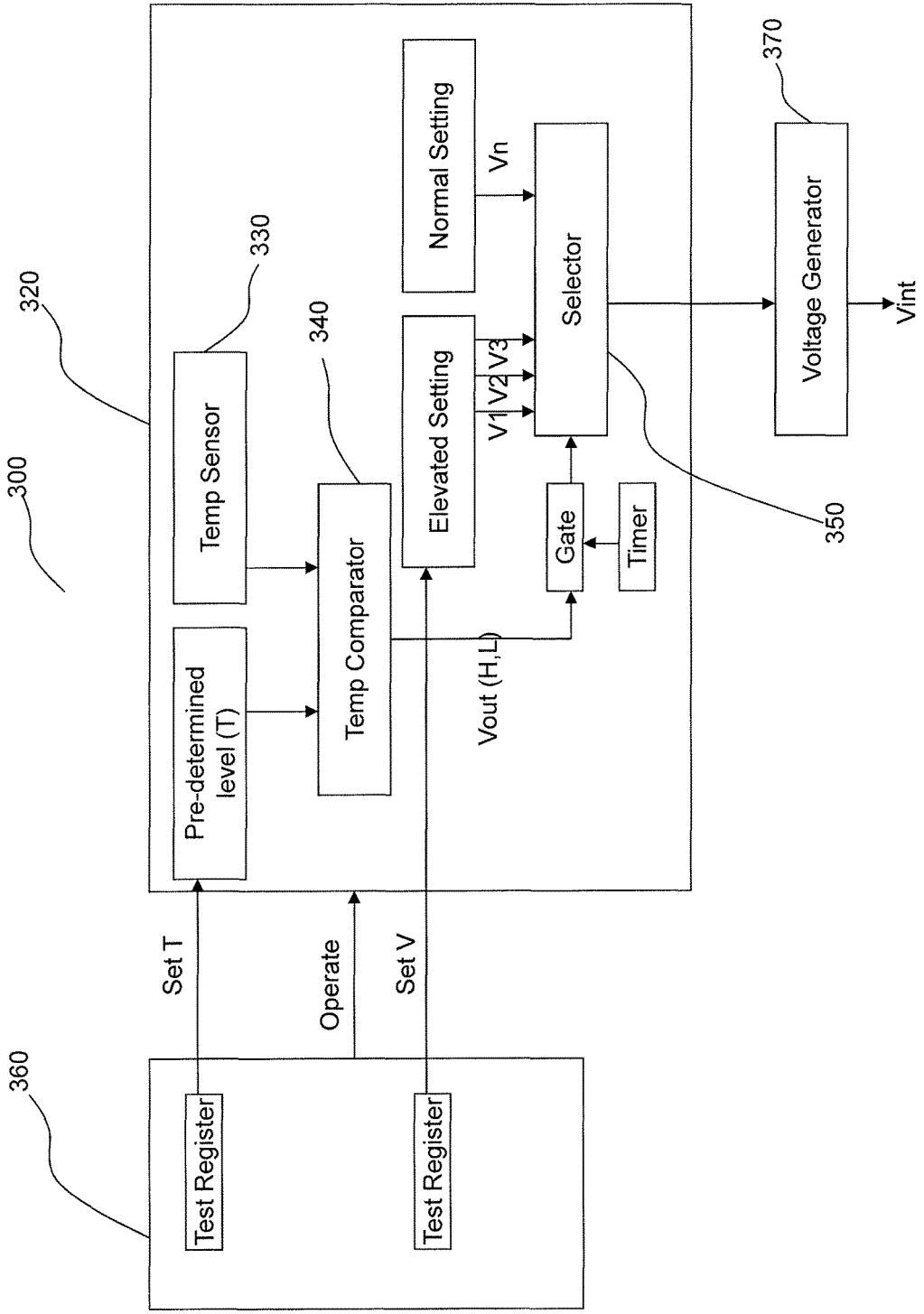
FIG. 3A is a block diagram showing an example of a configuration of a temperature monitor circuit 320 and a control circuit 360 according to a second embodiment.
Figure 3B:
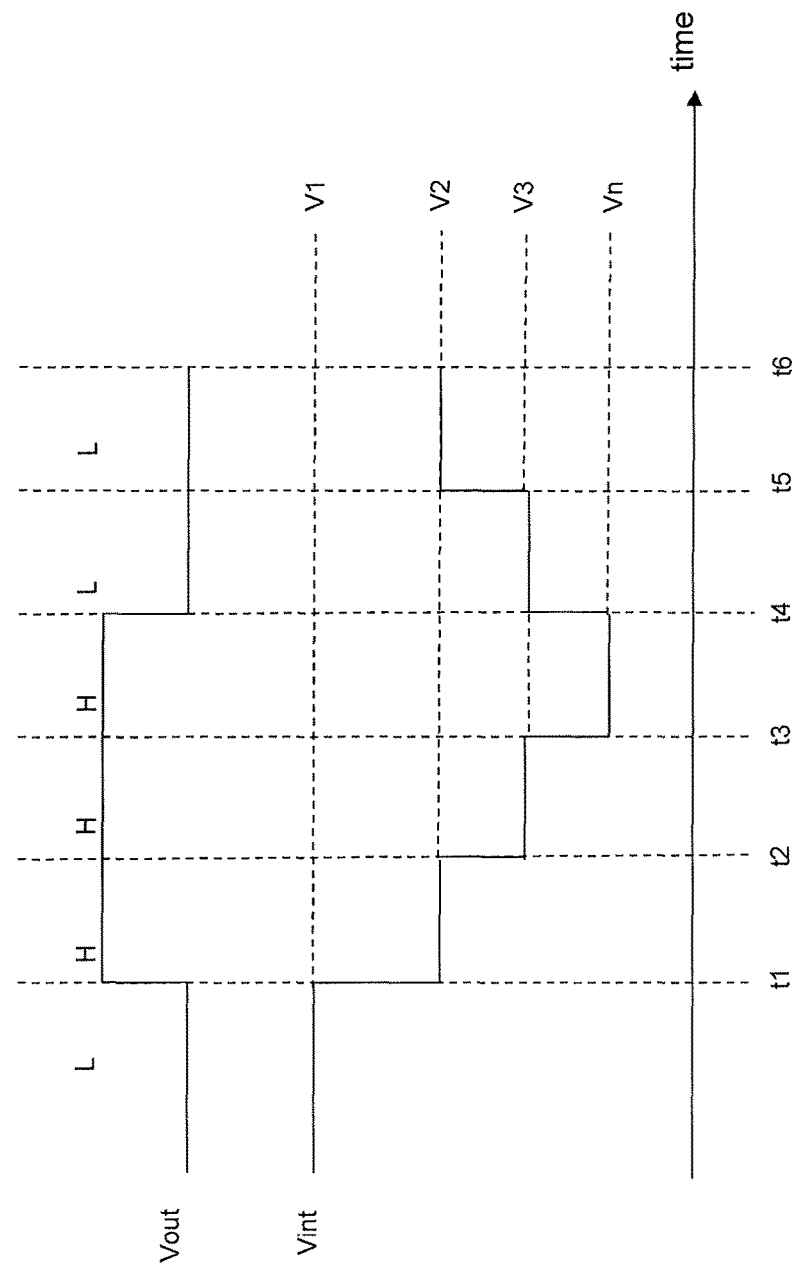
FIG. 3B is a timing diagram showing an example of an output voltage of the temperature comparator 340 and a voltage generated by the voltage generator 370 over a span of time according to the embodiment shown in FIG. 3A.

FIG. 3A is a block diagram showing an example of a configuration of a temperature monitor circuit 320 and a control circuit 360 according to a second embodiment. A circuit configuration and an operation of the temperature monitor circuit 320 and control circuit 360 are similar to the circuit configuration and the operation of the temperature monitor circuit 120 and control circuit 160, shown in FIG. 2A, and thus redundant explanations thereof will be omitted.

In FIG. 3A, the elevated voltage has three different voltage levels, V1, V2, and V3. V1 is highest voltage of all three, and V2 is a middle value, and V3 is the lowest voltage. The normal voltage setting remains to be Vn, and is lower than the lowest elevated voltage, V3. There is provided a gate and a timer to control transferring of signals of the path from the output of the temp comparator 340 to the selector 350. The gate is controlled by the timer, to control the timing, period, and/or frequency of the selection process of the selector 350—for example, how often the output of the temp comparator should be fed into the selector, how frequent the selector 350 should refresh the selected voltage level, etc.

Further, there may be provided one or more memory areas in the temperature monitor circuit 320 to store the predetermined temperature level T, one or more of the elevated voltage levels V1~V3, and/or the normal voltage level Vn.

Referring to FIG. 3A, if the temperature of the memory device 300 measured by the temperature sensor 330 is less than the predetermined temperature level T, the output of the temp comparator 340 is low (Vout=L). When Vout is low, the memory device may continue to operate under current conditions since the temperature of the memory device has not reached a high-risk level for overheating—for example, if the memory device has been operating under the operating voltage of V1, the selector 350 may continue to choose V1, and the voltage generator 370 may continue to generate V1 to be used the internal operating voltage.

If the temperature of the memory device 300 measured by the temperature sensor 330 is equal to or greater than the predetermined temperature level T, the output of the temp comparator 340 is high (Vout=H). When Vout is H, the testing condition is changed to reduce the current consumption and lower the temperature of the memory device 300—for example, if the memory device has been operating under the operating voltage of V1, the selector 350 may choose a voltage lower than V1, such as V2, V3, or Vn. However, the selector 350 does not choose a voltage higher than the currently-operating voltage, when Vout is high.

FIG. 3B is a timing diagram showing an example of an output voltage of the temperature comparator 340 and a voltage generated by the voltage generator 370, in the embodiment shown in FIG. 3A. From the initial time until t1, the memory device is in the testing mode as the Vint is at the elevated voltage level, V1. V1 is the highest voltage level selectable by the selector 350. Before t1, the output voltage of the temperature comparator, Vout, is kept low, indicating that the temperature of the memory device has not reached the predetermined high-risk temperature level T for overheating of the device. Thus, until t1, the memory device 100 continues to be operated under the testing condition with the elevated voltage level, V1.

Similar to FIG. 2B, the y-axis is not shown in FIG. 3B on purpose, and the Vout diagram is intended to be read separate from the Vint diagram. The values for Vout are not necessarily higher than the values for Vint. Further, the x-axis (the time-axis) is not on scale.

Referring to FIG. 3B, at t1 the output of the temperature comparator, Vout, is high, indicating that the temperature of the memory device has reached the trigger point, T. Then, the selector 350 selects V2, which is the next lower voltage from V1. Accordingly, Vint generated by the voltage generator 370 is reduced to V2 from V1.

However, the temperature of the memory device 300 does not go down below the trigger point, T, immediately after the reduction in the operating voltage, and the Vout continues to be high at t2. At t2, because Vout is still high, the selector 350 once again selects the next lower voltage, V3, forcing the voltage generator 370 to lower the Vint to V3 from V2. However, the temperature of the memory device 300 still does not go down below the trigger point, T, even after the voltage reduction, and Vout is still high even when the time is at t3. At t3, because Vout is still high, the selector 350 selects once again the next lower voltage, Vn.

After the operating voltage has been lowered to Vn from V3, the temperature finally starts to go down, and at t4, Vout becomes low, indicating that the operating temperature of the memory device 300 has gone down below the overheat trigger point, T.

At t4, since Vout is low, the selector 350 may select a step-higher voltage V3. The memory device is operated with this elevated voltage, V3, for a period of time until the time reaches t5. At t5, Vout is still kept low, indicating that the operating temperature of the memory device 300 has not reached the overheat trigger point, T, and thus the selector 350 once again selects the step higher voltage, V2.

Although it is described that the voltage level selected by the selector 350 is reduced or increased one step at a time, the voltage levels maybe reduced or increased multiple steps at a time depending on the overheat status and severity of the overheat status. For example, the output of the temp comparator 340 may indicate not only that the temperature of the memory device is greater than the predetermined level T, but also the amount by which the temperature of the memory device exceeds the predetermined level T. Depending on the exceeded amount (e.g., severity of the overheat), the selector 350 may select a voltage that is a step lower than the current-operating voltage, or a voltage multiple steps lower than the current-operating voltage, to bring about the immediate reduction of temperature.

Further, although FIG. 3B shows that the voltage is lowered all the way down to the normal operating voltage, Vn, to lower the temperature below the overheat trigger point T, it is always the case, as will be apparent to one of ordinary skill in the art. The temperature may go down below the overheat trigger point T, anytime after the voltage reduction, including immediately after the first voltage reduction, or second, etc.

Further, there may be any number (k) of elevated voltage levels, V1~Vk, and an increment between these voltage levels may be fixed or varied according to the design needs of the testing environment.

Various other algorithms and/or processes are available for implementation of the claimed subject matter, as will be apparent to one of ordinary skill in the art of memory design.

Still further, there may be other overheat-protection mechanisms that can be used when the temperature of the memory device reaches the overheat trigger point, besides reducing the operating voltage. For example, the memory device may completely be turned off, immediately putting the current consumption into minimum state, or the memory device may block the execution of further commands once the overheat protection mechanism is triggered. Further, any obvious variants of such measures can be implemented with the claimed subject matter, as will be apparent to one of ordinary skill in the art.

Figure 4:
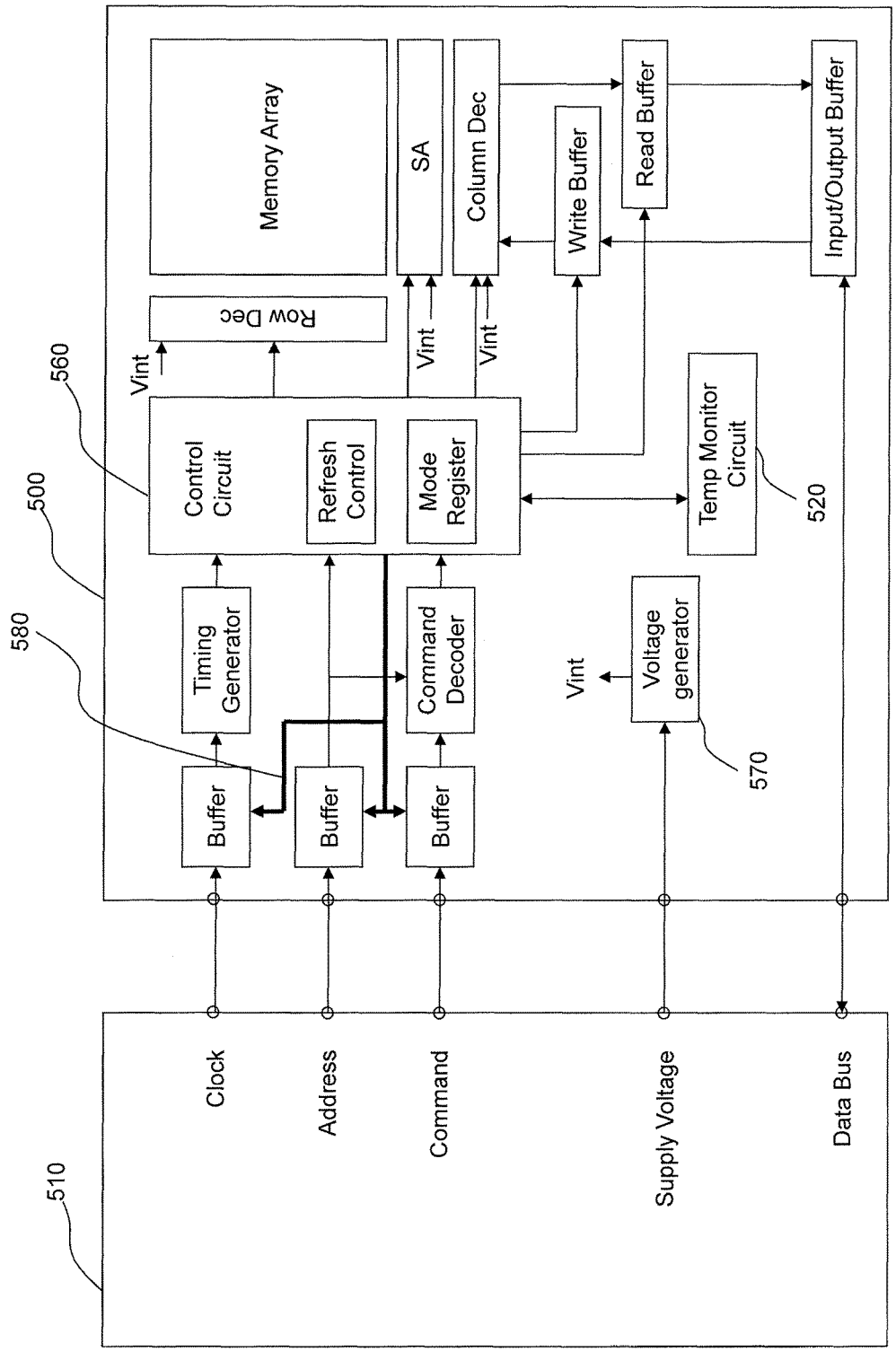
FIG. 4 is a schematic block diagram showing an example of a configuration of an IC device 500 connected to a tester device 510, according to a third embodiment.

FIG. 4 is a block diagram showing an example of a configuration of a voltage generator according to a third embodiment. In this example, the voltage generator is configured to stop producing the voltage, thereby completely turning off the memory device 400, when the temperature of the memory device 400 reaches the overheat trigger point T.

FIG. 4 is a schematic block diagram showing an example of a configuration of an IC device 500 connected to a tester device 510, according to a fourth embodiment. The terms "IC device 500," "DRAM 500," and "memory device 500" may be used interchangeably herein. In this example, the memory device 500 blocks the execution of commands once the temperature of the memory device reaches the overheat trigger point, T.

Referring to FIG. 4, the temp monitor circuit 520 is coupled to the control circuit 560. If the output of the temp comparator (not shown) inside the temp monitor circuit 520 is high—the temperature of the memory device detected by the temp sensor (not shown) is equal to or greater than the predetermined overheat trigger point, T—the control circuit 560 sends a reset signal to the clock buffer, address buffer, and/or command buffer in order to prevent the execution of any further commands.

An example of such a signal path is shown by element 580 in FIG. 4. The clock buffer may be reset so as to block transferring of the clock signals to the controller to stop the execution of the commands, and/or block receiving of any further clock signals to prevent the execution of any further commands. Or, a similar process may be done to the address buffer to stop the execution of the commands. Still additionally and/or alternatively, the command buffer may be reset such that it may prevent transferring of the command signals to the controller, thereby stopping the execution of the commands, and/or block receiving of any further command signals to stop the execution of any further commands.

There may still be various other ways to stop the execution of commands when the output of the temp comparator (not shown) inside the temp monitor circuit 520 is high, such as sending a block signal to command decoder blocking the decoding of any further commands, etc. For example, when the temperature of the memory device detected by the temp sensor becomes lower than the predetermined overheat trigger point, T, the DRAM 500 may inform a signal regarding the status information to the tester 510 via a signal line therebetween (not shown). The tester may resent command/address to the DRAM 500 based on the status information.

Figure 5:
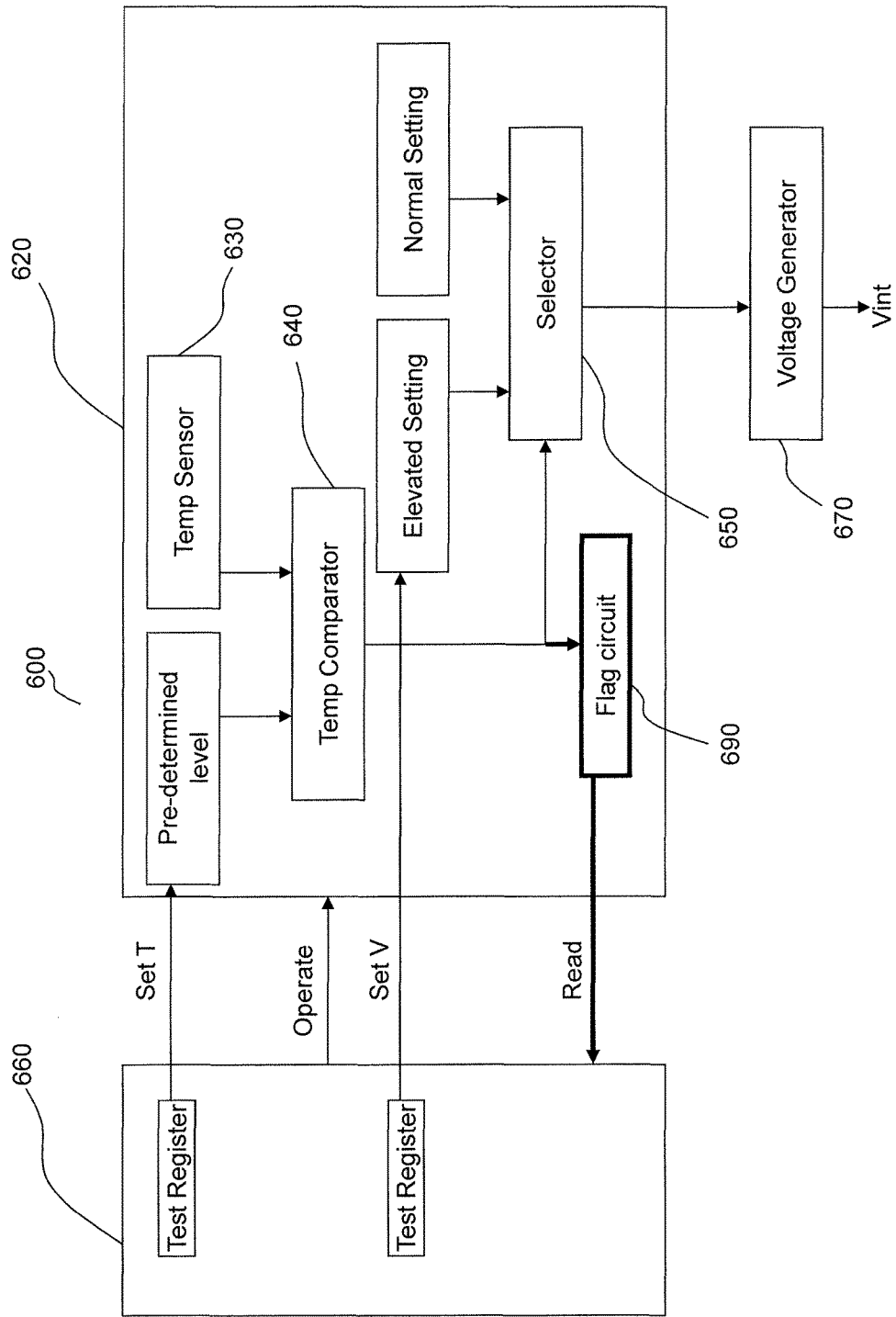
FIG. 5 is a block diagram showing an example of a configuration of a temperature monitor circuit 620 including a flag circuit 690.

FIG. 5 is a block diagram showing an example of a configuration of a temperature monitor circuit 620 including a flag circuit 690. The flag circuit 690 is coupled to the temp comparator 640. The flag circuit stores the output of the temp comparator 640 and any associative information so as to be readable later by any apparatus either internal or external to the device including the temperature monitor circuit 620.

Referring to FIG. 5, the flag circuit may have a one-bit structure to simply store the overheat/non-overheat status, or a multi-bit structure to store additional information including, for example, the severity of the overheat status, information identifying which parts were overheated, etc. The flag circuit may comprise a volatile register or a non-volatile register, or both. A non-voltage register may comprise a fuse that is blown, for example, by the high-voltage output of the temp comparator 640, to indicate the overheat status, which the tester device (not shown) will read upon the completion of the test. The tester 660 may control the operation such as elevating and falling down the voltage Vint, stopping and initiating the operation of the DRAM 600, or increasing or decreasing a frequency of the operation clock of the DRAM 620 based on the flag information read from the flag circuit 690.

Any obvious variants of the flag circuit can be made to the example shown in FIG. 5 and described above, which will be apparent to one of ordinary skill in the art reading the present disclosure.

Figure 6:
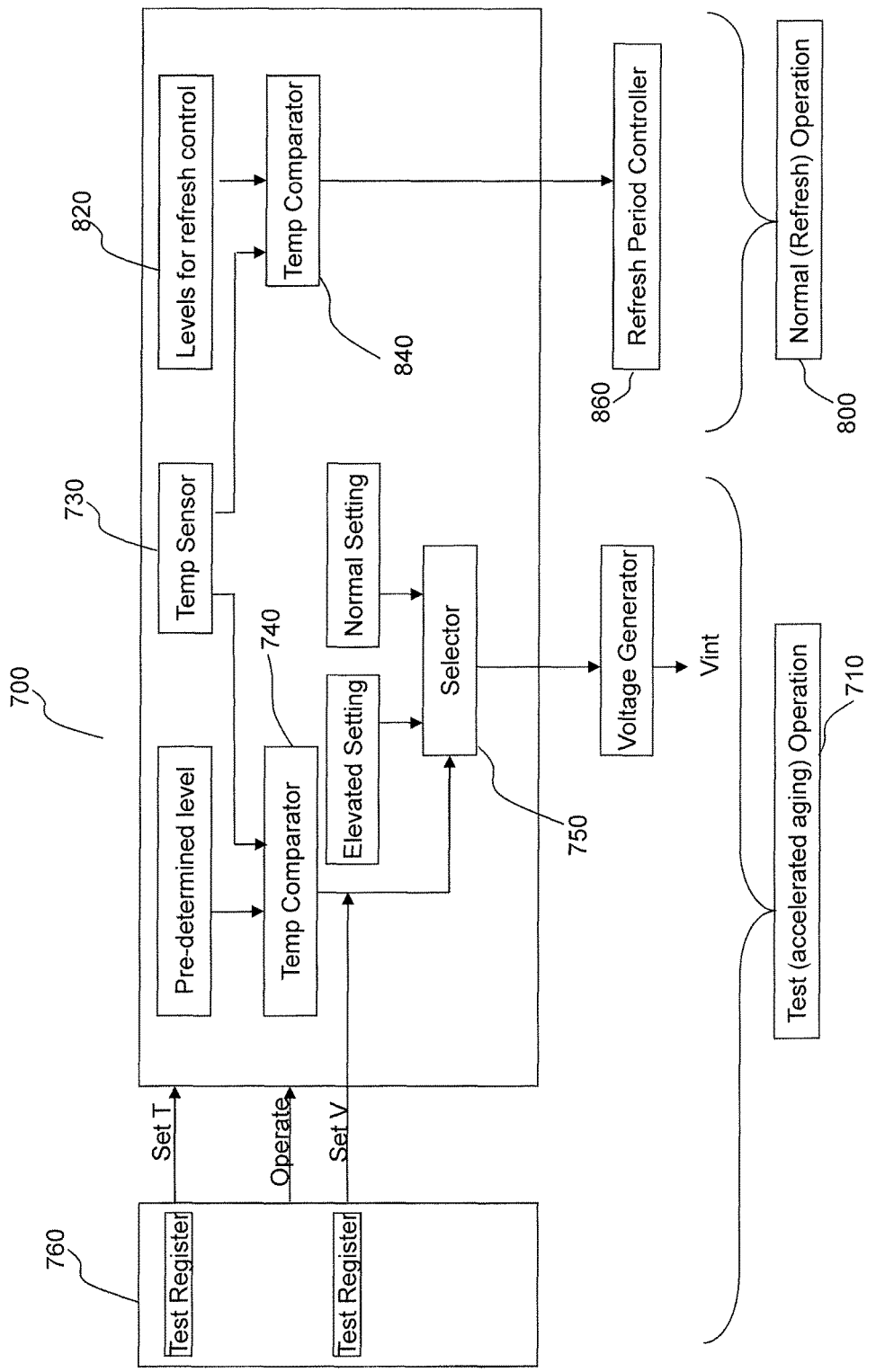
FIG. 6 is a block diagram showing an example of a configuration of an IC device 700 with a shared temperature sensor 730.

FIG. 6 is a block diagram showing an example of a configuration of an IC device 700 with a shared temperature sensor 730. A temperature sensor may be used to support operations other than the accelerated aging test operation. For example, a refresh operation of the memory device for refreshing the memory array in every fixed period of time may utilize a temperature sensor.

A memory cell array usually includes a plurality of memory cells, and a refresh operation performed on such memory cells may allow the memory to retain the information stored in the plurality of memory cells. There may be provided a refresh period controller inside the memory device, which is configured to determine a refresh period of the refresh operation. This refresh operation may be performed during the normal mode of the memory device. The refresh controller may determine the refresh period of the refresh operation based on the output of the temperature sensor. For example, the refresh period may be shorter when the operating temperature of the memory device is higher, and longer when the operating temperature of the memory device is lower.

In such a case, the accelerated aging test circuit and the refresh operation circuit may share one temperature sensor. For example, the temperature sensor may be used to support the refresh operation circuit during the normal mode of the memory device 700, while the temperature sensor may be used to support the accelerated aging test circuit during the test mode of the memory device 700. Such a sharing scheme may make the memory chip 700 more area-efficient and energy-efficient.

Referring to FIG. 6, the accelerated aging test circuit 710 includes the control circuit 760, temp sensor 730, temp comparator 740, selector 750, and/or voltage generator 770, among others. The refresh operation circuit includes the unit supplying levels for refresh control 820, temp sensor 730, temp comparator 840, and/or refresh period controller 860, among others. The temp sensor 730 is shared by both circuits. Consequently, the operating temperature of the memory device, detected by the temp sensor 730, is fed into the temp comparator 740 of the accelerated aging test circuit 710 as well as the temp comparator 840 of the refresh operation circuit 800. This avoids having to measure the temperature of the memory device 700 separately to support these two operations.

As explained above, the temp comparator 740 may compare the temperature of the memory device detected by the temp sensor 730 to the predetermined overheat trigger point, T, set by the test register 760. The temp comparator 840 may compare the temperature of the memory device detected by the temp sensor 730 to some predetermined levels for refresh control. Depending on the output of the temp comparator 840, the refresh period controller 860 may determine the refresh period of the memory device. The temp comparator 740 and the temp comparator 840 may be separate structures or different functional units in the same structure. It is noted that the refresh period controller is an example of an unit in an IC that can be controlled by a temperature sensor. CPU's frequencies or other things are also can be operated based on the temperature.

In sum, the memory device 100-700 may automatically suppress the overheating by automatically adjusting the testing conditions, turning off/on the memory device, and/or allowing/blocking the execution of commands. Accordingly, these memory devices may be put under any testing conditions without the risk of being overheated and suffering severe overheat damages.

It is apparent that the claimed subject matter is not limited to the above embodiments, but may be modified and changed without departing from the scope and spirit of the claims.

For example, in the above embodiments, although the output of the temp comparator is high when the operating temperature of the IC device is equal to or greater than the predetermined overheat trigger point, the condition for outputting a high output voltage is not limited to such a condition. Instead, the temp comparator may be configured to output a high voltage only when the operating temperature of the IC device is greater than the trigger point for some predetermined period of time, etc.

Further, although the overheat trigger point, T, is set by the test register, the trigger point may be either a fixed value preset during the manufacturing of the IC device, or a value that may be programmed by the tester device.

Still further, in the above embodiments, although the voltage generated by the voltage generator is a single voltage, it does not have to be limited to a single voltage. Multiple voltage levels may be derived from the output of the voltage generator, all or any portion of which can be affected by the output of the temp comparator.

Still further, the claimed subject matter may be applied to any IC chips and/or devices that are susceptible to accelerated aging degradation, including but not limited to the following: a data processing unit (e.g., CPU, microcomputer), input-output unit, Read-only memory (ROM), and other IC units. Such data processing unit, input-output unit, ROM and other IC units may be implemented in a cellarer phone device, a mobile device like mobile PC, tablet PC, car navigation/control system, or television device.

What is claimed is:

1. An integrated circuit chip, comprising:
a controller configured to control an operation of the integrated circuit chip in an accelerated aging test mode; and
an over-temperature monitor circuit coupled to the controller and configured to detect an over-temperature of the integrated circuit chip and output a state indicating the over-temperature during the accelerated aging test mode, wherein the over-temperature monitor circuit includes:
a temperature sensor configured to measure a temperature of the integrated circuit chip;
a memory area configured to memorize a trigger point;

a comparator circuit configured to compare the measured temperature and the trigger point, and to output a compared result; and a selector circuit configured to automatically select between a plurality of voltage levels to be used as an internal operating voltage based on the compared result from the comparator circuit, wherein the selector circuit is further configured to periodically check the compared result, and iteratively select a next lower of the plurality of voltages if the current temperature is above the trigger point or select a next higher of the plurality of voltages if the current temperature is below the trigger point.

2. The integrated circuit chip as claimed in claim 1, the integrated circuit chip further comprising:

an internal voltage generator configured to produce the internal operating voltage responsive to the voltage level selected by the selector circuit, the selector circuit is configured to select a first voltage level or a second voltage level in the accelerated aging test mode, wherein the internal voltage generator is configured to produce a first voltage or a second voltage higher than the first voltage as the internal operating voltage responsive to the first voltage level or the second voltage level selected by the selector respectively, and further configured to reduce the internal operating voltage from the second voltage responsive to the voltage level selected by the selector circuit.

3. The integrated circuit chip as claimed in claim 2, wherein the selector circuit is further configured to select a third voltage level, wherein the internal voltage generator is further configured to produce a third voltage higher than the first voltage and lower than the second voltage as the internal operating voltage responsive to the third voltage level selected by the selector circuit, and the internal voltage generator is configured to reduce the internal operating voltage from the second voltage to the third voltage or to the first voltage, responsive to the voltage level selected by the selector circuit.

4. The integrated circuit chip as claimed in claim 2, wherein the internal voltage generator is configured to stop producing the internal operating voltage responsive to the compared result.

5. The integrated circuit chip as claimed in claim 1, wherein the controller sets the integrated circuit chip into a reset state based on the compared result.

6. The integrated circuit chip as claimed in claim 1, wherein the controller of the integrated circuit chip blocks an execution of a command input from outside of the integrated circuit chip, according to the compared result.

7. The integrated circuit chip as claimed in claim 6, further comprising:

a buffer configured to receive the command input from the outside of the integrated circuit chip, and to transfer the command input to the controller, wherein the controller deactivates the buffer so as to block the transferring of the command input to the controller.

8. The integrated circuit chip as claimed in claim 1, the integrated circuit chip further comprising:

a flag circuit configured to store the compared result, wherein the compared result stored in the flag circuit can be read out by an apparatus outside of the integrated circuit chip.

9. The integrated circuit chip as claimed in claim 1, the integrated circuit chip further comprising:

a memory cell array including a plurality of memory cells wherein a refresh operation is performed to retain an information stored in the plurality of memory cells;

a refresh period controller configured to control a refresh period of the refresh operation based on an output of the temperature sensor, the temperature sensor being shared with the refresh period controller in the test mode.

10. The apparatus of claim 1, wherein the controller is configured to provide the trigger point and the plurality of voltage levels to the over-temperature monitor circuit.

11. A memory chip, comprising:

a controller configured to control an operation of the memory chip in an accelerated aging test mode;

a temperature sensor configured to measure a temperature of the memory chip:

a comparator circuit configured to be activated during the accelerated aging test mode to compare the temperature of the memory chip during the accelerated aging test mode with a predetermined value and output a compared result; and a selector circuit configured to automatically select between a plurality of voltage levels to be used as an internal operating voltage based on the compared result from the comparator, wherein the selector circuit is further configured to periodically check the compared result, and iteratively select a next lower of the plurality of voltages if the current temperature is above the predetermined value or select a next higher of the plurality of voltages if the current temperature is below the predetermined value.

12. A method of performing an accelerated aging test for an integrated circuit chip, the method comprising:

entering the integrated circuit chip to the accelerated aging test by a tester coupled to the integrated circuit chip, wherein the integrated circuit chip includes a temperature monitor circuit and a selector circuit;

monitoring a temperature of the integrated circuit chip by using the temperature monitor circuit while executing the accelerated aging test to produce a control signal within the integrated circuit chip based on a comparison of the monitored temperature to a trigger point; and automatically selecting a voltage level from a plurality of voltage levels for an operating voltage based on the control signal by using the selector circuit to control the temperature of the integrated circuit chip based on the control signal while executing the accelerated aging test, the automatically selectin comprising iteratively selecting a next lower of the plurality of voltages if control signal is in a first state or iteratively selecting a next higher of the plurality of voltages if the control signal is in a second state.

13. The method as claimed in claim 12, further comprising:

changing a voltage level of a voltage generated inside of the integrated circuit chip that is used as an operating voltage of the integrated circuit chip using the selector circuit.

14. The method as claimed in claim 12, wherein the integrated circuit chip stops executing a command in the integrated circuit chip, based on the control signal, the command input provided from the tester.

15. The method as claimed in claim 12, wherein the tester stops supplying a command to the integrated circuit chip, based on the control signal.

16. The method as claimed in claim 12, wherein the integrated circuit chip includes a data processing unit.

\* \* \* \* \*